United States Patent
Chia et al.

(10) Patent No.: US 9,933,278 B2
(45) Date of Patent: Apr. 3, 2018

(54) ADAPTABLE VOLTAGE LEVEL DETECTION WITH RESISTIVE LADDER

(75) Inventors: Wei Ming Dan Chia, Singapore (SG); Bee Ching Kong, Singapore (SG); Chieh Kuen Woo, Singapore (SG)

(73) Assignee: Continental Automotive GmbH, Hannover (DE)

( * ) Notice: Subject to any disclaimer, the term of this patent is extended or adjusted under 35 U.S.C. 154(b) by 976 days.

(21) Appl. No.: 13/261,979

(22) PCT Filed: Dec. 2, 2011

(86) PCT No.: PCT/IB2011/055423
§ 371 (c)(1),
(2), (4) Date: Nov. 17, 2014

(87) PCT Pub. No.: WO2013/079997
PCT Pub. Date: Jun. 6, 2013

(65) Prior Publication Data
US 2015/0061646 A1   Mar. 5, 2015

(51) Int. Cl.
| | | |
|---|---|---|
| H01H 47/00 | (2006.01) |
| G01D 5/14 | (2006.01) |
| G01R 31/327 | (2006.01) |
| G01R 19/00 | (2006.01) |
| G01R 31/00 | (2006.01) |

(52) U.S. Cl.
CPC ........... *G01D 5/14* (2013.01); *G01R 19/0084* (2013.01); *G01R 31/3277* (2013.01); *G01R 31/006* (2013.01)

(58) Field of Classification Search
None
See application file for complete search history.

(56) References Cited

U.S. PATENT DOCUMENTS

| | | |
|---|---|---|
| 4,096,435 A | 6/1978 | Sabe |
| 4,506,255 A | 3/1985 | Sasaki |
| 5,014,038 A | 5/1991 | Leigh-Monstevens et al. |
| 2003/0151389 A1* | 8/2003 | Cummings ........... H02J 7/0016 320/122 |
| 2005/0168072 A1 | 8/2005 | Saito et al. |
| 2007/0285027 A1* | 12/2007 | Gehman ................ H01H 23/02 315/209 SC |
| 2009/0167093 A1 | 7/2009 | Nguyen et al. |

FOREIGN PATENT DOCUMENTS

| | | |
|---|---|---|
| GB | 2 095 449 | 9/1982 |
| JP | 61-093964 | 5/1986 |
| WO | WO 2010/010423 | 1/2010 |

* cited by examiner

*Primary Examiner* — Long Nguyen
(74) *Attorney, Agent, or Firm* — Cozen O'Conner

(57) ABSTRACT

A switch actuation detection unit has a switch actuation voltage reception terminal and a logic circuit. The logic circuit includes a first port, a second port, a zener diode, and a signal port. The switch actuation voltage reception terminal receives a switch actuation voltage. The first port is connected to the switch actuation voltage reception terminal. A first terminal of the zener diode is connected to the switch actuation voltage reception terminal while a second terminal of the zener diode is connected to the second port. The signal port provides a plurality of pre-determined switch state signals.

13 Claims, 5 Drawing Sheets

| Actuated button | Port number | Button detection voltage range | Converted digital value range |
|---|---|---|---|
| 1 | port1 | 0.0 to 0.5 volts | 00 hex to 2A hex (00 decimal to 42 decimal) |
| 1 | port2 | 0.0 volts | 00 hex (00 decimal) |
| 2 | port1 | 0.5 to 1.0 volts | 2B hex to 55 hex (42 decimal to 85 decimal) |
| 2 | port2 | 0.0 volts | 00 hex (00 decimal) |
| 3 | port1 | 1.0 to 1.5 volts | 56 hex to 7F hex (86 decimal to 127 decimal) |
| 3 | port2 | 0.0 volts | 00 hex (00 decimal) |
| 4 | port1 | 1.5 to 2.0 volts | 80 hex to AA hex (128 decimal to 170 decimal) |
| 4 | port2 | 0.0 volts | 00 hex (00 decimal) |
| 5 | port1 | 2.0 to 2.5 volts | AB hex to D4 hex (171 decimal to 212 decimal) |
| 5 | port2 | 0.0 volts | 00 hex (00 decimal) |
| 6 | port1 | 2.5 to 3.0 volts | D5 hex to FF hex (213 decimal to 255 decimal) |
| 6 | port2 | 0.0 volts | 00 hex (00 decimal) |

FIG. 2

| Actuated button | Port number | Button detection voltage range | Converted digital value range |
|---|---|---|---|
| 7 | port1 | 3.0 volts | FF hex (255 decimal) |
| 7 | port2 | 0.0 to 0.5 volts | 00 hex to 2A hex (00 decimal to 42 decimal) |
| 8 | port1 | 3.0 volts | FF hex (255 decimal) |
| 8 | port2 | 0.5 to 1.0 volts | 2B hex to 55 hex (42 decimal to 85 decimal) |
| 9 | port1 | 3.0 volts | FF hex (255 decimal) |
| 9 | port2 | 1.0 to 1.5 volts | 56 hex to 7F hex (86 decimal to 127 decimal) |
| 10 | port1 | 3.0 volts | FF hex (255 decimal) |
| 10 | port2 | 1.5 to 2.0 volts | 80 hex to AA hex (128 decimal to 170 decimal) |
| 11 | port1 | 3.0 volts | FF hex (255 decimal) |
| 11 | port2 | 2.0 to 2.5 volts | AB hex to D4 hex (171 decimal to 212 decimal) |
| 12 | port1 | 3.0 volts | FF hex (255 decimal) |
| 12 | port2 | 2.5 to 3.0 volts | D5 hex to FF hex (213 decimal to 255 decimal) |

FIG. 3

| Actuated button | Port number | Button detection voltage range | Converted digital value range |
|---|---|---|---|
| 1 | port1 | 0.0 to 1.0 volts | 00 hex to 55 hex (00 decimal to 85 decimal) |
| 1 | port2 | 0.0 volts | 00 hex (00 decimal) |
| 2 | port1 | 1.0 to 2.0 volts | 56 hex to AA hex (86 decimal to 170 decimal) |
| 2 | port2 | 0 volts | 00 hex (00 decimal) |
| 3 | port1 | 2.0 to 3.0 volts | AB hex to FF hex (171 decimal to 255 decimal) |
| 3 | port2 | 0.0 volts | 00 hex (00 decimal) |
| 4 | port1 | 3.0 volts | FF hex (255 decimal) |
| 4 | port2 | 0.0 to 1.0 volts | 00 hex to 55 hex (00 decimal to 85 decimal) |
| 5 | port1 | 3.0 volts | FF hex (255 decimal) |
| 5 | port2 | 1.0 to 2.0 volts | 56 hex to AA hex (86 decimal to 170 decimal) |
| 6 | port1 | 3.0 volts | FF hex (255 decimal) |
| 6 | port2 | 2.0 to 3.0 volts | AB hex to FF hex (171 decimal to 255 decimal) |

FIG. 4

ADAPTABLE VOLTAGE LEVEL DETECTION WITH RESISTIVE LADDER

CROSS-REFERENCE TO RELATED APPLICATIONS

This is a U.S. national stage of application No. PCT/IB2011/055423, filed on 2 Dec. 2011, the content of which is incorporated herein by reference.

BACKGROUND OF THE INVENTION

1. Field of the Invention

This application relates to a remote control with buttons. In particular, the application relates to a steering wheel remote control for a vehicle.

2. Related Art

U.S. Pat. No. 4,096,435 discloses a level indicating device that has a high reliability and long life. The device includes first and second terminals for receiving a signal.

JP 610 93 964 (A) discloses a series circuit with a LED (light emitting diode) and with a zener diode being connected in parallel to another series circuit of another LED and a resistor for displaying an input voltage level in steps.

SUMMARY OF THE INVENTION

It is an object of the application to provide an improved steering wheel remote control.

It is believed that the steering wheel remote control can be improved by extending a voltage range of a detection of its button actuation.

The steering wheel remote control unit has a resistive ladder configuration with multiple control buttons. The resistive ladder configuration is connected to an electronic module with a voltage level detection interface.

In contrast, the electronic module includes a microprocessor with at least two analog to digital ports. At least one of the analog to digital port includes a voltage level shifter that comprises a zener diode with a corresponding passive component.

In use, a user indicates a desired command to the electronic module via actuating one of the buttons of the steering wheel remote control. This actuation alters a resistance of the resistive ladder configuration.

The resistive ladder configuration then transmits a button actuated voltage, which corresponds with the altered resistance, to the voltage level detection interface of the electronic module.

The voltage level detected interface later receives this button-actuated voltage and transmits the button-actuated voltage to the analog to digital ports. At least one of the analog to digital ports receive this button-actuated voltage via its voltage level shifter, wherein the zener diode of the voltage level shifter reduces or shifts the received button-actuated voltage by a pre-determined amount. The zener diode here acts as a voltage drop. In another words, one of the ports receives the button-actuated voltage while the other ports receive the button-actuated voltage that is reduced. The button-actuated voltage may have a maximum voltage due a voltage clamping by a voltage clamping diode.

The analog to digital ports have one same input operating voltage range and they later convert the received voltage levels to their digital values. The electronic module later detects or determines which button is actuated from the digital values from the analog to digital ports and the electronic module response in accordance to the determined actuated button.

The voltage level shifter provides a benefit in that it allows the analog to digital port to measure a wider range of button-actuated voltage since at least two ports are used for the measurement, rather than one port.

The wider button-actuated voltage range has advantages. In one example, the wider button-actuated voltage range allows a designer to provide a steering wheel remote control unit with more control buttons. Each of the buttons would be assigned with a particular voltage range within the button-actuated voltage range. Due to part variance, voltage variance, or electrical ground offset, this button voltage range has a predetermined minimum range value. If the button were assigned with a voltage range that is less than this pre-determined minimum range value, the recognition of the actuated button would not be reliable. In another example, the wider button-actuated voltage range enables a designed to increase the reliability of detecting the actuated buttons by assigning a wider voltage range to each button.

This cost of implementing this application is also often low since the application can often be implemented using existing ports that are not used without much adaption.

This button-actuated voltage range is not limited by the supply voltage level of the electronic module. This is different from other implementations, wherein its button-actuated voltage range is associated with its electronic module supply voltage level. This is especially important as the present trend of electrical circuit development is toward providing electrical circuits with lower operating voltages.

Often, the zener diodes are selected such that they provide voltage shift or voltage drops that correspond to one or more multiples of a supply voltage of the electronic module or to one or more multiples of an operating voltage of the analog to digital ports. The supply voltage of the electronic module is often related to the operating voltage of the analog to digital ports.

The application provides a switch actuation detection unit of a vehicle control unit. The vehicle often refers to a car.

The vehicle control unit also includes a Steering Wheel Remote Control (SWRC) that is connected to the switch actuation detection unit. The SWRC has a plurality of buttons. The switch actuation detection unit includes a switch actuation voltage reception terminal and a logic circuit.

The logic circuit has a first analog to digital port, a second analog to digital port, and a zener diode. Specifically, the first analog to digital port is electrically connected to the switch actuation voltage reception terminal. A first terminal of the zener diode is electrically connected to the switch actuation voltage reception terminal while a second terminal of the zener diode is electrically connected to the second analog to digital port. The first terminal here is called a cathode while the second terminal here is called an anode.

In use, the buttons are intended for activating one of multiple functions of the vehicle. Often, the buttons are used for controlling functions of an audio system of the vehicle. A user may push one of the buttons for indicating a desired function of the user. Since the switches discussed herein are, in the illustrated embodiments, implemented as buttons, the terms "button" and "switch" may be used interchangeably herein.

The switch actuation voltage reception terminal then receives a switch actuation voltage from the Steering Wheel Remote Control (SWRC). The switch actuation voltage is generated in accordance to the button that is actuated by the user. The received switch actuation voltage is also received by the first analog to digital port and by the first terminal of the zener diode.

The switch actuation detection unit provides two modes, name normal mode and a saturation mode.

The normal mode is provided when the switch actuation voltage is less than or is equal to a pre-determined port saturation voltage. The logic circuit then provides one of the predetermined switch state signals according to the switch actuation voltage that is present at the first analog to digital port.

In comparison, the saturation mode is provided when the switch actuation voltage exceeds the pre-determined port saturation voltage. In this mode, the second terminal of the zener diode transmits a shifted voltage to the second analog to digital port, wherein the shifted voltage is generated according to the switch actuation voltage and to a predetermined zener breakdown voltage of the zener diode. The logic circuit later provides the pre-determined switch state signal according to the pre-determined port saturation voltage that is present at the first analog to digital port and to the shifted voltage that is present at the second analog to digital port.

The pre-determined switch state signal is provided by the logic circuit to an external electrical circuit.

The switch actuation detection unit advantageously provides two modes, which allows an extended number of buttons to be detected. This is unlike other detection units that provide only the normal mode. In practice, a range of voltage, which is more than a minimum range value, should be assigned to each button because of component tolerances and electrical earth offsets. This then serves to limit of number of button detection. This limitation is not present in the application which overcomes the limited by provided the saturation mode that extends the number of button detection.

The switch actuation detection unit often includes a pull-up power supply with a pull-up resistor that connects to the switch actuation voltage reception terminal. The pull-up power supply with the pull-up resistor increases the voltage value of the switch actuation voltage reception terminal.

A first input resistor can be connected between the switch actuation voltage reception terminal and the first analog to digital port for limiting the electrical current received by the first analog to digital port. Excessive electrical current can damage the first analog to digital port.

For additional protection, a first clamping zener diode can be connected between the first analog to digital port and the electrical ground, wherein the first clamping zener diode channels electrical current of over-voltages at the first analog to digital port to the electrical ground.

Similarly, a second input resistor can be connected between the switch actuation voltage reception terminal and the analog to digital port. A second clamping zener diode can be connected between the second analog to digital port and the electrically ground.

The switch actuation detection unit can include a processor that comprises the first analog to digital port and the second analog to digital port. Processors often provided with analog to digital ports and are often in electrical circuit boards.

For additional protection, an electro-static discharge (ESD) capacitor can connect the switch actuation voltage reception terminal to an electrical ground.

The application also provides a vehicle control unit that includes the above-mentioned switch actuation detection unit, a Steering Wheel Remote Control (SWRC), and a wire network that connects the switch actuation detection unit to the Steering Wheel Remote Control.

In use, the SWRC receives a button actuation from a user and provide a voltage according to the button actuation. This button actuation voltage is then transmitted via the wire network to the switch actuation detection unit, which later provides a predetermined switch state signal according to the button actuation voltage. The switch state signal is afterward used to provide a function, as indicated by the switch state signal, to the user.

As example, the user can actuate a button to indicate a desire for a louder volume of sound from a car audio system. The SWRC receives the button actuation and then provides a voltage corresponding to the button actuation to the switch actuation detection unit. The switch actuation detection unit later provides a state signal corresponding to the button actuation voltage to the car audio system. The car audio system subsequently provides the desired audio volume, as indicated by the state signal, to the user.

The wire network can include one or more wires for transmitting electrical signals.

The SWRC often comprises a resistive network with a plurality of switches, wherein an actuation of the switch alters a resistance of the resistive network by connecting or disconnecting parts of the resistive network.

The application provides a method of determined a state of a switch of a Steering Wheel Remote Control of a vehicle control unit.

The method includes a step of a terminal receiving a switch actuation voltage. A first port together with a zener diode individually then receives the switch actuation voltage from the terminal.

When the switch actuation voltage is less than a predetermined saturation voltage, the method later includes a step of operating in a normal mode, wherein a logic circuit providing a pre-determined switch state signal according to the switch actuation voltage at the first port.

When the switch actuation voltage exceeds a pre-determined port saturation voltage, the method includes a step of operating in a saturation mode, wherein the zener diode transmits a shifted voltage to a second port. The shifted voltage is generated according to the switch actuation voltage and to a predetermined zener breakdown voltage of the zener diode. The logic circuit then provides the pre-determined switch state signal according to the pre-determined port saturation voltage at the first port and according to the shifted voltage at the second port.

For easy computation by the logic circuit, the method often includes a step of the first port converting the switch actuation voltage to its digital value and the second port converting the shifted voltage to its digital value.

The application provides a method of operating a vehicle control unit. The method comprises a step of a user actuating a switch. The actuated switch is then determined as described above. A function is afterward performed according to the actuated switch.

BRIEF DESCRIPTION OF THE DRAWINGS

FIG. 2 illustrates a first part of a table for ports of a first implementation of the vehicle control unit of FIG. 1, the vehicle control unit has the ports that can each detect 6 buttons;

FIG. 3 illustrates a second part of the table of FIG. 2;

FIG. 4 illustrates a table for ports of a second implementation of the vehicle control unit of FIG. 1, the port has improved reliability of button actuation detection.

DETAILED DESCRIPTION OF THE PRESENTLY PREFERRED EMBODIMENTS

In the following description, details are provided to describe embodiments of the application. It shall be apparent one skilled in the art, however, that the embodiments may be practiced without such details.

Some parts of the embodiments, which are shown in the figures. below, have similar parts. The similar parts may have the same names or the similar part numbers. The description of such similar parts also applies by reference to other similar parts, where appropriate, thereby reducing repetition of text without limiting the disclosure.

Figure 1:
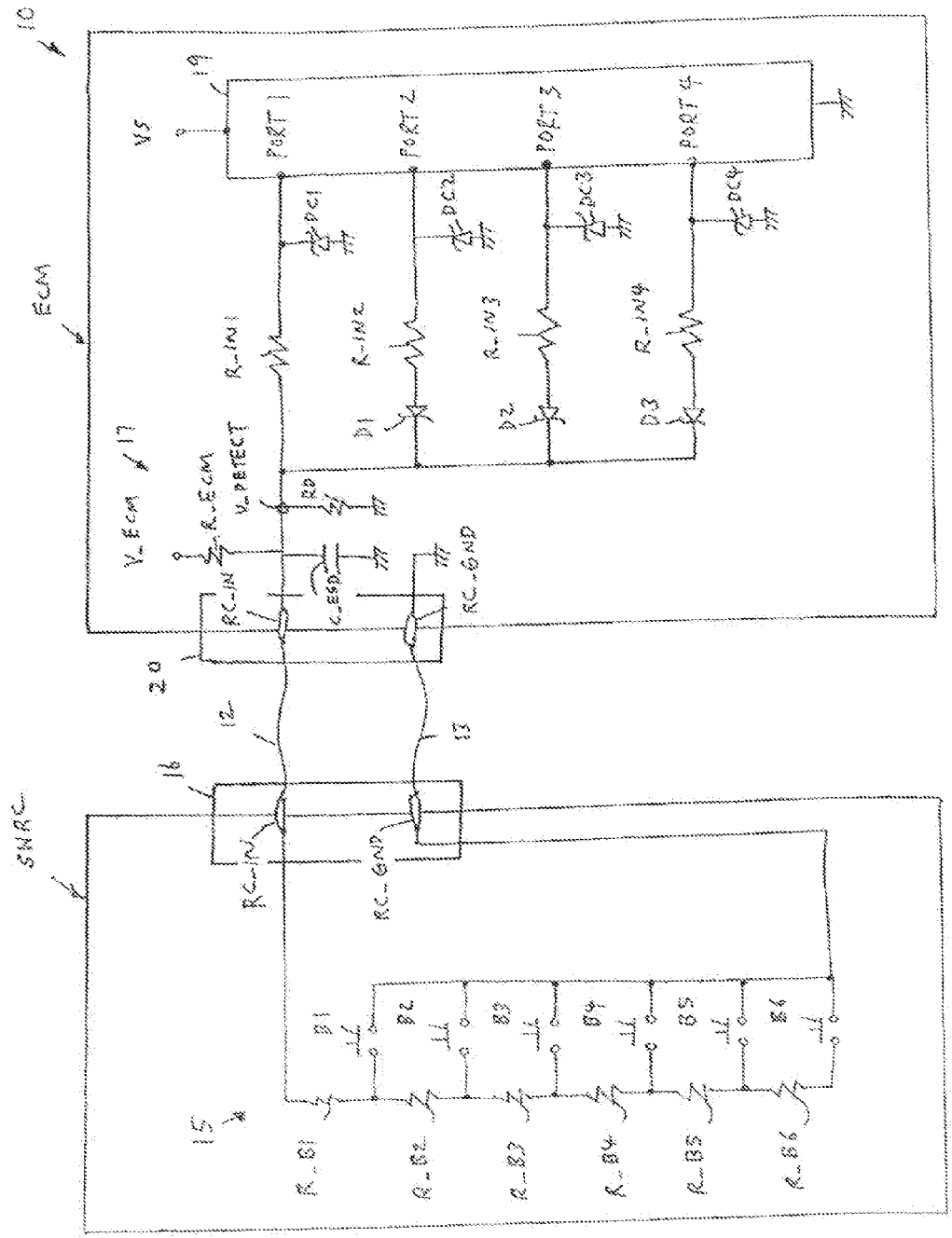
FIG. 1 illustrates a vehicle control unit.

FIG. 1 shows a vehicle control unit 10, which comprises a Steering Wheel Remote Control (SWRC) being connected electrically to an Electronic Control Module (ECM) by a pair of conductive wires 12 and 13.

Referring to the SWRC, it comprises a resistive ladder configuration 15 being connected electrically to an interface port 16. This interface port 16 includes a pair of interface terminals RC_IN and RC_GND.

The resistive ladder configuration 15 comprises a plurality of button resistors R_B1, R_B2, R_B3, R_B4, R_B5, and R_B6 with a plurality of control buttons B1, B2, B3, B4, B5, and B6.

In particular, the resistors $R\_B_1$, R_B2, R_B3, R_B4, R_B5, and R_B6 are connected in a series. A first end of the resistor R_B1 is connected to the terminal RC_IN of the SWRC.

A second end of the resistor R_B1 is connected to a first end of the resistor R_B6 and to a first end of the button B1. A second end of the button B1 is connected to the terminal RC_GND of the SWRC.

In a similar manner, a second end of the resistor R_B2 is connected to a first end of the resistor R_B3 and to a first end of the button B2. A second end of the button B2 is connected to the terminal RC_GND of the SWRC. A second end of the resistor R_B3 is connected to a first end of the resistor R_B4 and to a first end of the button B3. A second end of the button B3 is connected to the terminal RC_GND of the SWRC. A second end of the resistor R_B4 is connected to a first end of the resistor R_B5 and to a first end of the button B4. A second end of the button B4 is connected to the terminal RC_GND of the SWRC. A second end of the resistor R_B5 is connected to a first end of the resistor R_B6 and to a first end of the button B5. A second end of the button B5 is connected to the terminal RC_GND of the SWRC. A second end of the resistor R_B6 is connected to a first end of the button B6. A second end of the button 136 is connected to the terminal RC_GND of the SWRC.

Referring to ECM, it comprises a power supply unit 17 and a microprocessor 19 with a plurality of voltage shifters being connected to an interface port 20. The interface port 20 includes a pair of interface terminals RC_IN and RC_GND. The terminal RC_GND of the ECM is connected to an electrical ground.

The power supply unit 17 comprises a pull-up power supply V_ECM, which is connected to a first end of a pull-up resistor R_ECM. A second terminal of the resistor R_ECM is connected to the terminal RC_IN of the ECM, to a first terminal of an electrostatic protection capacitor C_ESD, and to a first terminal of a resistor RD. A second terminal of the capacitor C_ESD and a second terminal of the resistor RD are connected to the electrical ground.

The microprocessor 19 is connected to a power supply VS and it includes a plurality of an analog to digital ports port1, port2, port3, and port4.

The port port1 is connected to a cathode of a voltage clamping zener diode DC1 and to a first end of an input resistor R_IN1. A second end of the resistor R_IN1 is connected to the terminal RC_IN of the ECM while an anode of the zener diode DC1 is connected to the electrical ground.

The port port2 is connected to a cathode of a voltage clamping zener diode DC2 and to a first end of an input resistor R_IN2. A second end of the resistor R_IN2 is connected to a cathode of a voltage drop zener diode D1 while an anode of the zener diode D1 is connected to the terminal RC_IN of the ECM. An anode of the zener diode DC2 is connected to the electrical ground.

Similarly, the port port3 is connected to a cathode of a voltage clamping zener diode DC3 and to a first end of an input resistor R_IN3. A second end of the resistor R_IN3 is connected to a cathode of a voltage drop zener diode D2 while an anode of the zener diode D2 is connected to the terminal RC_IN of the ECM. An anode of the zener diode DC3 is connected to the electrical ground.

The port port4 is connected to a cathode of a voltage clamping zener diode DC4 and to a first end of an input resistor R_IN4. A second end of the resistor R_IN4 is connected to a cathode of a voltage drop zener diode D3 while an anode of the zener diode D3 is connected to the terminal RC_IN of the ECM. An anode of the zener diode DC4 is connected to the electrical ground.

Referring to the SWRC and the ECM, the conductive wire 12 connects the interface terminal RC_IN of the SWRC to the interface terminal RC_IN of the ECM. The other conductive wire 13 connects the interface terminal RC_GND of the SWRC to the interface terminal RC_GND of the ECM.

In a general sense, one wire, instead of two wires, can be used to connect the SWRC to the ECM.

In application, the SWRC is often installed on a steering wheel of a vehicle. Specifically, the resistive ladder configuration 15 is often embedded in the steering wheel while the buttons B1, B2, B3, B4, B5, and B6 are often located on an outer surface of the steering wheel. In contrast, the ECM is often installed on another part of the vehicle.

Referring to the voltage supply unit 17, the power supply V_ECM provides a constant voltage, wherein an electrical current of the power supply V_ECM flows via pull-up resistor R_ECM to the terminal RC_IN of the interface port 20 of the ECM and to the terminal RC_IN of the interface port 16 of the SWRC.

The capacitor C_ESD acts to protect the interface port 20 of the ECM from electro-static discharge (ESD) by channeling electrical charges of any ESD via the capacitor C_ESD to the electrical ground.

The buttons B1, B2, B3, B4, B5, and B6 are assigned with functions and are intended for actuating by a user to indicate a selection and activating of the function by the user. One example of the function is for increasing volume of a sound system of a car, which the user can select and activate. A user can actuate one of the buttons B1, B2, B3, B4, B5, and B6 to indicate his selection of the desired function.

The button actuation also acts to alter the resistance of the resistive ladder configuration 15 as measured or observed at the terminals RC_IN and RC_GND of the interface 16 of the SWRC.

Considering an example, if the user actuates only the button B1, a composite resistance R_P, which formed by a resistance of the resistive ladder configuration 15 of the SWRC together with a resistance of the resistor RD, is then represented by, $$R\_P = \frac{RD * R\_B1}{RD + R\_B1}$$

If the user actuates only the button B2, the composite resistance R_P is represented by $$R\_P = \frac{RD * (R\_B1 + R\_B2)}{RD + (R\_B1 + R\_B2)}$$

If the user actuates only the button B3, the composite resistance R_P is represented by $$R\_P = \frac{RD * (R\_B1 + R\_B1 + R\_B3)}{RD + (R\_B1 + R\_B2 + R\_B3)}$$

As can be seen above, when actuated, the button B1, B2, B3, B4, B5, and B6 serves to change the composite resistance R_P. The changed composite resistance R_P also alters a voltage V_detect, which is observed at the terminal RC_IN of the interface 20 of the ECM. This observed voltage V_detect is represented by $$V\_detect = \frac{R\_P}{R\_P + R\_ECM} * V\_ECM$$

As can be seen above, a higher value of V_ECM would lead to a higher value of V_detect. The higher value of V_detect supports detection of more buttons, which is explained later.

The voltage V_detect is also observed at the terminal RC_IN of the interface port 16 because both the terminal RC_IN of the interface port 20 and the terminal RC_IN of the interface port 16 are connected with the same conductive wire 12.

The value of the voltage V_detect falls within a range, which is assigned to the actuated button. In application, this actuated button range has a minimum range value due to voltage fluctuation, component tolerances, and ground offsets, which are present and thus expected in a hardware system. Assigning a value that is less than the minimum range voltage to the actuated button range would cause unreliable detection or determined of the actuated button.

During the design phase, the targeted or planned voltage V_detect is computed based on targeted or planned composite resistance R_P that corresponds to the actuated button. An upper limit and a lower limit of the range of the voltage V_detect for the actuated button is then determined according to this computed voltage V_detect and considering tolerances of resistors of the composite resistance R_P.

For example, if the range of the voltage V_detect has a value of 3.0 volts and the button that is assigned with a voltage range of 0.5 volts, a maximum of 6 buttons can be incorporated in the SWRC. If a function for diagnostics for short to electrical ground is assigned one button voltage range and a function for detecting no button is pressed is assigned another button voltage range within the range of voltage V_detect, only a maximum of 4 buttons can be incorporated.

Considering the port port1, one end of the input resistor R_IN1 receives the voltage V_detect, which is present at the terminal RC_IN of the interface port 20. Another end of the input resistor R_IN1 transmits all or most of the voltage V_detect to the port port1. This is because the input resistance of the port port1 is often very large in comparison with the resistance of the input resistor R_IN1 such that the voltage drop that occurs across the resistor R_IN1 is quite small. In other words, all, if not most, of the voltage V_detect is transmitted to the port port1. The port port1 hence receives a voltage V_port1, which is expressed as $$V\_port1 = V\_detect$$

The port port1 then converts this received voltage V_port1 to its digital form.

The zener diodes D1, D2, and D3 have different breakdown voltages. Electrical currents flow from cathodes of the zener diodes D1, D2, and D3 to anodes of the zener diodes D1, D2, and D3 when voltages at the said cathodes exceed their respective breakdown voltages. The electrical currents do not flow from the cathodes of the zener diodes D1, D2, and D3 to its anodes when voltages at the said cathodes are less than exceed their respective breakdown voltages.

Considering the port port2, the cathode of the zener diode D1 also receives the voltage V_detect. When the voltage V_detect exceeds a breakdown voltage V_BD_D1 of the zener diode D1, the anode of the zener diode D1 then transmits a voltage via the resistor R_IN2 to the port port2. Assuming the voltage drop across the resistor R_IN2 is insignificant as the electrical current passing the resistor R_IN2 is often in the micro-amp range, the port port2 receives a voltage V_port2, which is expressed as $$V\_port2 = V\_detect - V\_BD\_D1$$

The port port2 then converts this received voltage V_port2 to its digital form.

Similarly, considering the port port3, the cathode of the zener diode D2 also receives the voltage V_detect. If the voltage V_detect exceeds a breakdown voltage V_BD_D2 of the zener diode D2, the anode of the zener diode D2 then sends a voltage via the resistor R_IN3 to the port port3. Assuming the voltage drop across the resistor R_IN3 is very small, the port port3 receives a voltage V_port3, which is expressed as $$V\_port3 = V\_detect - V\_BD\_D2$$

The port port3 later convert this received voltage V_port3 to its digital form.

Considering the port port4, the cathode of the zener diode D3 also receives the voltage V_detect. When the voltage V_detect exceeds a breakdown voltage V_BD_D3 of the zener diode D3, the anode of the zener diode D3 then transmits a voltage via the resistor R_IN4 to the port port4. Supposing the voltage drop across the resistor R_IN4 is insignificant, the port port4 receives a voltage V_port4, which is expressed as $$V\_port4 = V\_detect - V\_BD\_D3$$

The port port4 afterward convert this received voltage V_port4 to its digital form.

The ports port1, port2, port3, and port4 receive their voltages at practically the same time. In other words, the port1, port2, port3, and port4 operate independently in receiving their voltages and converting their received voltages to their digital forms.

The different voltage drops enable the ports port2, port3, and port4 to measure a wider range of voltages. As mentioned earlier, a higher value of V_ECM would result in a higher value of V_detect. More ports may need to be added during design to handle this higher value of V_detect. With this application, it is possible to increase the number of ports for handling the said higher value of V_detect.

The microprocessor 19 is often equipped with software to manage and treat the converted digital values. The software determines the button actuated by the user from the converted digital values and responds according to the determined actuation button.

In short, the microprocessor 19 has different ports port1, port2, port3, and port 4 being electrically connected to separate branches for detecting the voltage V_detect, the branches include the input resistors R_IN1, R_IN2, R_IN3, and R_IN4 with the corresponding zener diodes D1, D2, and D3. The separate zener diodes D1, D2, and D3 provide different voltage-drops when their breakdown voltages are exceeded.

In a general sense, the above microprocessor 19 can have more than four ports while the branches can have more than four input resistors.

The clamping diodes DC1, DC2, DC3, and DC4 serve to clamp voltages being present respectively at the ports port1, port2, port 3, and port 4 for protecting the said ports port1, port2, port 3, and port 4 from being damaged by voltage surges or by over-voltages.

Several implementations of the vehicle control unit 10 are possible.

In one implementation, the ECM includes only ports port1, port2, and port 3. The voltage V_ECM provides a standard voltage of 9 volts while the power supply VS provides a standard voltage of 3 volts. The ports port1, port2, and port3 have a detection or measurement range from 0 volt to the standard voltage of the power supply VS.

The diode D1 is selected such that it has a reverse breakdown voltage or a clamping voltage of 3 volts. At the reverse breakdown voltage, an electrical current flows from a cathode of the diode D1 to an anode of the diode D1. The diode D2 is selected such that it has a clamping voltage of 6 volts, which is twice the clamping voltage of diode D1.

In this case, the different ports port1, port2, and port3 have different voltage detection ranges. The port port1 measures the voltage V_detect, when the voltage V_detect has a value that ranges from 0 volt to 3 volts. The ports port1 and port2 measure the voltage V_detect, when the voltage V_detect has a value that ranges from 3 volts to 6 volts. The ports port1, port2, and port3 measure the voltage V_detect when the voltage V_detect has a value that ranges from 6 volts to 9 volts.

If the actuated button B1, B2, B3, B4, B5, or B6 generates the voltage V_detect of 4.5 volts, the port port1 would read or measure 3.0 volts, the port port2 would read 1.5 volts while the port port3 will read 0 volt. The values of port 1 and port 3 will then have a sum of 4.5 (=3.0+1.5) volts.

In another implementation, the zener diode D1, D2, and D3 have breakdown voltages with values that are equal to or are similar to one or more multiple times of the value the voltage V_ECM.

Specifically, the breakdown voltage of the zener diode D1 is equal to one time of the voltage V_ECM. The breakdown voltage of the zener diode D2 is equal to two times of the voltage V_ECM while the breakdown voltage of the zener diode D3 is equal to three times of the voltage V_ECM.

In most implementations, analog to digital converters of most present microprocessor have sufficient resolutions such that they can be used for this implementations. This means that implementation of this application does not need separate dedicated analog to digital converters. This directly translates to lower cost of implementation.

The ports port1, port2, port3, and port4 often detect or measure a voltage that ranges between 0 volts and the voltage V_ECM.

In a general sense, the microprocessor 19 can have only two ports port1 and port2. It can also have one port port1 and multiple other ports, such as port port2, port3, and port4. The other ports can be one or more ports.

The embodiment can work without the resistors R_IN1, R_IN2, R_IN3, and R_IN4, without the clamping diodes DC1, DC2, DC3, and DC4.

FIGS. 2 and 3 show a table for the ports port1 and port2 for a first implementation of the vehicle control unit of FIG. 1. The ports port1 and port2 are each adapted to detect 6 buttons. When the button B1 is actuated, the port port1 would read a voltage that is within a range from 0.0 to 0.5 V (volt) and it then convert this voltage to its digital value, which ranges from 00 hex to 2A hex or from 00 decimal to 42 decimal. The port port2 would read 0 volts. Similarly, when other buttons is actuated, the readings of the ports port1 and port2 are shown in FIG. 2.

FIG. 4 shows a table for the ports port1 and port2 of a second implementation of the vehicle control unit of FIG. 1. The ports port1 and port2 have improved reliability of button actuation detection as the voltage ranges assigned to the buttons are increased. The increase allows for larger component tolerance and voltage fluctuations. The readings of the ports port1 and port2 corresponding to the button actuation are as shown in the table.

Thus, with different ranges of detection voltage and software design configurations, it is possible to create a matrix of different button actuation detection for different needs and requirements, such as higher reliability of button actuation.

In summary, this embodiment provides an improved remote control unit. The remote control unit includes a remote control and an electronic module.

The remote control comprises multiple control buttons and a resistive ladder configuration. The resistive ladder configuration is connected to an interface of the electronic module. The electronic module includes a novel voltage-level-detection device, which includes a zener diode.

The zener diodes can be implemented easily without major changes to design at a low cost.

In use, the remote control is often installed in a steering wheel of a vehicle, such as car.

The buttons are intended for actuating by a user. The actuation serves to alter a resistance of the resistive ladder configuration. The resistive ladder configuration provides an output button-actuated voltage to the interface of the electronic module, which corresponds to this altered resistance. The resistive ladder configuration and the buttons are adapted such the output button-actuated voltage falls within a predetermined voltage range that corresponds with the actuated button. The resistive ladder configuration also transmits this output button-actuated voltage to the interface of the electronic module.

The voltage-level-detection device then receives the button-actuated voltage via the interface. The zener diode acts to extend a range of voltages, which the voltage-level-detection device is able to receive. The electronic module later determines which button is actuated accordingly to the received button-actuated voltage and it responds according to the determined actuated button. As one example, a user may actuate a button by pushing the button, the button being associated with an increased volume function of a car radio. The electronic module then increases the volume of the car radio upon determining the actuation of the said button.

This extended voltage range of the voltage-level-detection device allows the remote control to support more buttons.

Such a remote control can operate with different types of SWRC, which are supplied by different vendors, with minor or no adjustments. Present SWRC does not to be designed to work with remote control. This is significant benefit.

The remote control can be implemented using existing microprocessor without additional interface wires or additional processors and without power supply adaption. This is different from other implementations, wherein their voltage-level-detection corresponds to their operating voltages.

Figure 5:
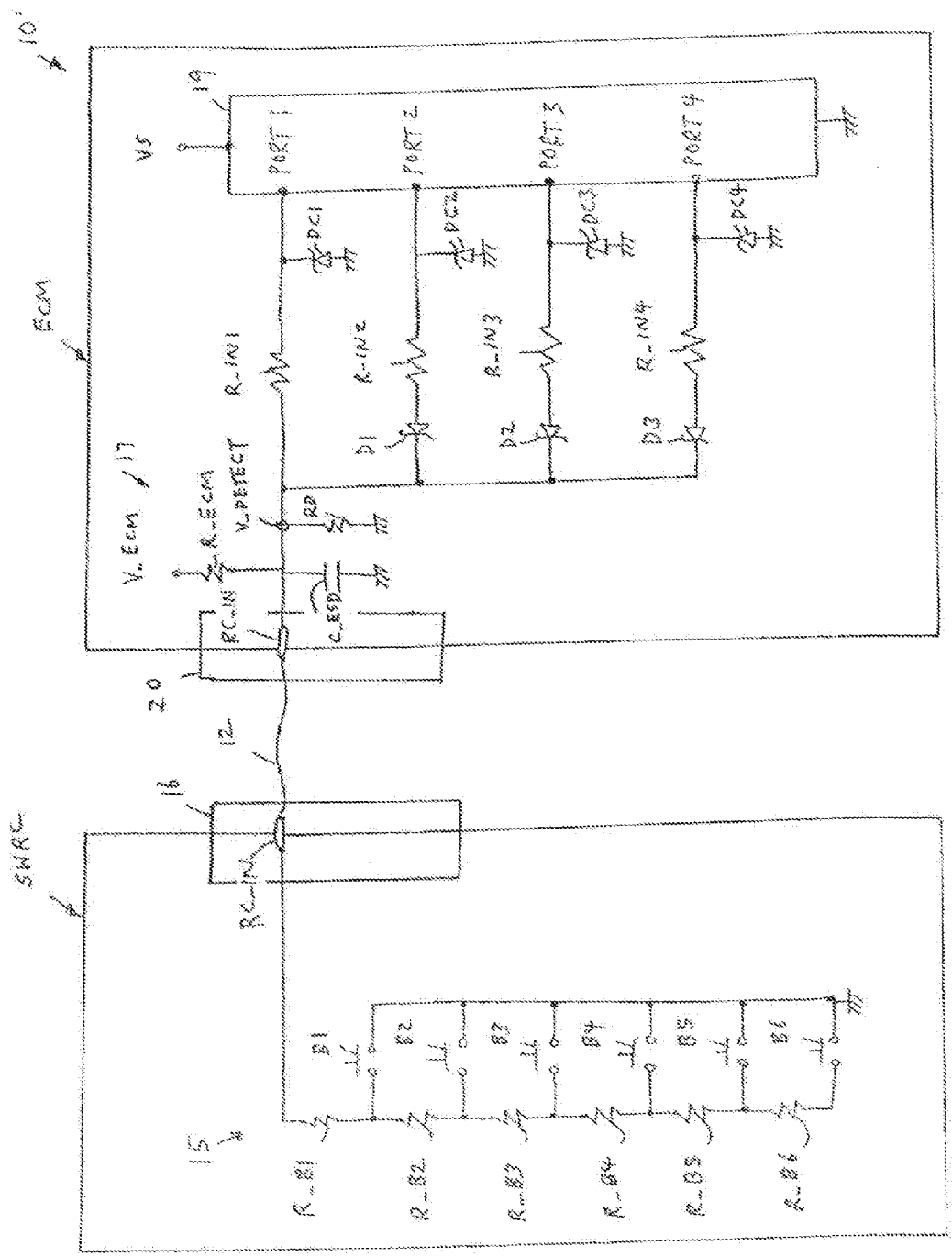
FIG. 5 illustrates another vehicle control unit, which is variation of the vehicle control unit of FIG. 1.

FIG. 5 shows another vehicle control unit 10', which is variation of the vehicle control unit 10 of FIG. 1.

The vehicle control unit 10' includes parts of the vehicle control unit 10. The vehicle control unit 10' has a Steering Wheel Remote Control (SWRC) being connected electrically to an Electronic Control Module (ECM) by a single conductive wire 12. The SWRC and the ECM are each connected to different electrical ground points, which are also connected to each other.

This figure shows electrical connection between SWRC and the ECM by one conductive wire instead of two conductive wires.

Consider one implementation of FIG. 1, wherein the button resistor R_B1 has a design resistance of 100 ohms. The button resistor R_B2 has a design resistance of 270 ohms. The button resistor R_B3 has a design resistance of 390 ohms. The button resistor R_B4 has a design resistance of 820 ohms. The button resistor R_B5 has a design resistance of 2,200 ohms. The button resistor R_B6 has a design resistance of 27,000 ohms.

The power supply V_ECM has a design voltage of 12 volts. The power supply VS has a design voltage of 3 volts. The pull-up resistor R_ECM has a design resistance of 1,000 ohms. The resistor RD has a design resistance of 18,000 ohms.

The input resistors R_IN1, R_IN2, R_IN3, and R_IN4 each have a design resistance of 4.7 kilo-ohms and a maximum resistance of 5 kilo-ohms. The voltage clamping zener diodes DC1, DC2, DC3, and DC4 each have a design clamping voltage of 3 volts.

The voltage drop zener diode D1 has a design breakdown voltage of 3 volts. The voltage drop zener diode D2 has a design breakdown voltage of 6 volts. The voltage drop zener diode D3 has a design breakdown voltage of 9 volts. The ports port1, port2, port3, and port 4 are each designed to receive a voltage of between 0 volts and 3 volts.

In use, when the button B1 is actuated, the composite resistance R_P would have a resistance of about 99.45 ohms and the voltage V_detect would have a voltage of about 1.09 volts. In practice, the actuated button can be correctly detected even when this design voltage V_detect varies between 0 volts and 2 volts due to component variation.

When the button B2 is actuated, the composite resistance R_P would have a resistance of about 362.55 ohms and the voltage V_detect would have a voltage of about 3.19 volts. In practice, the actuated button can be correctly detected even when this design voltage V_detect varies between 2 volts and 4 volts due to component variation.

When the button B3 is actuated, the composite resistance R_P would have a resistance of about 729.21 ohms and the voltage V_detect would have a voltage of about 5.06 volts.

In practice, the actuated button can be correctly detected even when this design voltage V_detect varies between 4 volts and 6 volts due to component variation.

When the button B4 is actuated, the composite resistance R_P would have a resistance of about 1452.5 ohms and the voltage V_detect would have a voltage of about 7.11 volts. In practice, the actuated button can be correctly detected even when this design voltage V_detect varies between 6 volts and 8 volts due to component variation.

When the button B5 is actuated, the composite resistance R_P would have a resistance of about 3,123.97 ohms and the voltage V_detect would have a voltage of about 9.09 volts. In practice, the actuated button can be correctly detected even when this design voltage V_detect varies between 8 volts and 10 volts due to component variation.

When the button B6 is actuated, the composite resistance R_P would have a resistance of about 11,357.93 ohms and the voltage V_detect would have a voltage of about 11.03 volts. In practice, the actuated button can be correctly detected even when this design voltage V_detect varies between 10 volts and 12 volts due to component variation.

In general, the resistor RD should have a large design resistance and the pull-up resistor R_ECM should have a small design resistance to increase voltage range of the voltage V_detect. The design resistance value of the button resistor R_B1 should be small such that the design resistance value of the button resistor R_B6 is not too large. If voltage VS is designed to be too small, this could possibly lead to too small design breakdown voltage of the voltage clamping zener diodes DC1, DC2, and DC3.

Although the above description contains much specificity, this should not be construed as limiting the scope of the embodiments but merely providing illustration of the foreseeable embodiments. The above stated advantages of the embodiments should not be construed especially as limiting the scope of the embodiments but merely to explain possible achievements if the described embodiments are put into practice. Thus, the scope of the embodiments should be determined by the claims and their equivalents, rather than by the examples given.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:
1. A switch actuation detection unit comprising:
a switch actuation voltage reception terminal configured to receive a switch actuation voltage; and
a logic circuit having:
a first port being connected to the switch actuation voltage reception terminal,
a second port, and a zener diode, wherein a first terminal of the zener diode is connected to the switch actuation voltage reception terminal and a second terminal of the zener diode is connected to the second port, the logic circuit being configured to provide, in any given instance, one from among a plurality of pre-determined switch state signals, wherein the switch actuation detection unit provides:
a normal mode when the switch actuation voltage is less than a pre-determined port saturation voltage, and
a saturation mode when the switch actuation voltage exceeds the pre-determined port saturation voltage, such that:
in the normal mode, the logic circuit provides the one from among the plurality of the pre-determined switch state signals in accordance with the switch actuation voltage at the first port, and
in the saturation mode, the zener diode transmits a shifted voltage to the second port, the shifted voltage being generated according to the switch actuation voltage and to a predetermined zener breakdown voltage, and the logic circuit providing the one from among the plurality of the pre-determined switch state signals in accordance with the pre-determined port saturation voltage at the first port and to the shifted voltage at the second port.

2. The switch actuation detection unit according to claim 1, further comprising a pull-up power supply connected to the switch actuation voltage reception terminal.

3. The switch actuation detection unit according to claim 1, further comprising a first input resistor connected between the switch actuation voltage reception terminal and the first port.

4. The switch actuation detection unit according to claim 1, further comprising a second input resistor connected between the switch actuation voltage reception terminal and the second port.

5. The switch actuation detection unit according to claim 1, further comprising a first clamping diode connected to the first port.

6. The switch actuation detection unit according to claim 1, further comprising a second clamping diode connected to the second port.

7. The switch actuation detection unit according to claim 1, further comprising a processor comprising the first port and the second port.

8. The switch actuation detection unit according to claim 1, further comprising a capacitor connecting the switch actuation voltage reception terminal to an electrical ground.

9. A vehicle control unit comprising:
a Steering Wheel Remote Control having a plurality of switches in the form of buttons and configured to provide a switch actuation voltage on the basis of which ones of the plurality of buttons are activated;
a switch actuation detection unit comprising:
a switch actuation voltage reception terminal configured to receive the switch actuation voltage; and
a logic circuit having:
a first port being connected to the switch actuation voltage reception terminal,
a second port, and
a zener diode, wherein a first terminal of the zener diode is connected to the switch actuation voltage reception terminal and a second terminal of the zener diode is connected to the second port, the logic circuit being configured to provide, in any given instance, one from among a plurality of predetermined switch state signals, wherein the switch actuation detection unit provides:
a normal mode when the switch actuation voltage is less than a pre-determined port saturation voltage, and
a saturation mode when the switch actuation voltage exceeds the pre-determined port saturation voltage, such that:
in the normal mode, the logic circuit provides the one from among the plurality of the pre-determined switch state signals in accordance with the switch actuation voltage at the first port, and
in the saturation mode, the zener diode transmits a shifted voltage to the second port, the shifted voltage being generated according to the switch actuation voltage and to a predetermined zener breakdown voltage, and the logic circuit providing the one from among the plurality of the pre-determined switch state signals in accordance with the pre-determined port saturation voltage at the first port and to the shifted voltage at the second port; and
a wire network connecting the switch actuation detection unit to the Steering Wheel Remote Control,
wherein the switch actuation detection unit is configured to receive the switch actuation voltage determined based on which buttons have been actuated and provide the one from among the plurality of predetermined switch state signals according to the determined switch actuation voltage.

10. The vehicle control unit according to claim 9, wherein the Steering Wheel Remote Control comprises a resistive network with the plurality of switches in the form of buttons, wherein actuation of various ones of the switches in the form of buttons alters a resistance of the resistive network.

11. A method, for a switch actuation detection unit, of determining a state of one or more switches, the switch actuation detection unit having a terminal, a first port, a second port, a Zener diode, and a logic circuit, the method comprising:
receiving, by the terminal, a switch actuation voltage;
receiving, by the first port, the switch actuation voltage from the terminal;
receiving, by the zener diode, the switch actuation voltage from the terminal;
operating in a first mode when the switch actuation voltage is less than a pre-determined saturation voltage, wherein the logic circuit provides a predetermined switch state signal according to the switch actuation voltage at the first port; and
operating in a second mode when the switch actuation voltage at the first port exceeds the pre-determined port saturation voltage,
wherein
the zener diode transmits a shifted voltage to the second port, the shifted voltage being generated according to the switch actuation voltage and according to a predetermined zener breakdown voltage, and
the logic circuit provides the predetermined switch state signal according to the pre-determined port saturation voltage at the first port and according to the shifted voltage at the second port.

12. The method according to claim 11, further comprising converting, by the first port, the switch actuation voltage to its digital value, and converting, by the second port, the shifted voltage to its digital value.

13. The method according to claim 11, comprising:
actuating, by a user, one or more of the one or more switches;
determining the actuated switch or switches; and
performing a function on the basis of the actuated switch or switches.

* * * * *